(12) United States Patent
Yang et al.

(10) Patent No.: US 7,863,181 B2
(45) Date of Patent: Jan. 4, 2011

(54) METHOD FOR MANUFACTURING A DEVICE HAVING A HIGH ASPECT RATIO VIA

(75) Inventors: Hsueh An Yang, Taipei (TW); Po Jen Cheng, Kaohsiung (TW)

(73) Assignee: Advanced Semiconductor Engineering, Inc., Pingtung (TW)

( * ) Notice: Subject to any disclaimer, the term of this patent is extended or adjusted under 35 U.S.C. 154(b) by 233 days.

(21) Appl. No.: 12/170,138

(22) Filed: Jul. 9, 2008

(65) Prior Publication Data

US 2009/0047782 A1 Feb. 19, 2009

(30) Foreign Application Priority Data

Aug. 17, 2007 (TW) .............................. 96130401 A

(51) Int. Cl.
*H01L 21/4763* (2006.01)
(52) U.S. Cl. ..................... 438/622; 438/627; 438/629; 257/E21.575
(58) Field of Classification Search ................. 438/597, 438/622, 626, 628, 629; 257/E21.575
See application file for complete search history.

(56) References Cited

U.S. PATENT DOCUMENTS

| 4,661,204 | A | * | 4/1987 | Mathur et al. | ............... 438/224 |
| 5,330,629 | A | * | 7/1994 | Cunningham et al. | .. 204/192.17 |
| 7,414,314 | B2 | * | 8/2008 | Abe | ........................... 257/751 |
| 2007/0069347 | A1 | * | 3/2007 | Lin et al. | ..................... 257/673 |
| 2008/0081458 | A1 | * | 4/2008 | Lin et al. | ..................... 438/620 |

* cited by examiner

*Primary Examiner*—Michael Trinh

(57) ABSTRACT

Method for manufacturing a device having a conductive via includes the following steps. A dielectric material layer including a through hole is formed on a substrate. A seed metallic layer is formed on the dielectric material layer and in the through hole. A metallic layer is formed on the seed metallic layer, and is filled in the through hole. The metallic layer located over the seed metallic layer and outside the through hole is etched by a spin etching process, whereby the metallic layer located in the through hole is formed to a lower portion. An upper portion is formed on the lower portion, and a metallic trace is formed on the seed metallic layer, wherein the upper and lower portions is formed to a conductive via, and the conductive via and the metallic trace expose a part of the seed metallic layer. The exposed seed metallic layer is etched.

15 Claims, 6 Drawing Sheets

METHOD FOR MANUFACTURING A DEVICE HAVING A HIGH ASPECT RATIO VIA

CROSS REFERENCE TO RELATED APPLICATION

This application claims the priority benefit of Taiwan Patent Application Serial Number 096130401, filed Aug. 17, 2007, the full disclosure of which is incorporated herein by reference.

BACKGROUND OF THE INVENTION

1. Field of the Invention

The present invention generally relates to a method for manufacturing a device having a conductive via, and more particularly to a method for manufacturing a device having a conductive via wherein the predetermined aspect ratio of a through hole of a dielectric material layer can be substantially increased.

2. Description of the Related Art

Components located on the active surface of a semiconductor device become smaller in size as the geometric shape of the semiconductor device becomes gradually smaller. For example, the passive component (e.g. a capacitor) is constituted by two metallic layers and one conductive via. In order to decrease the volume of the capacitor, it is necessary to decrease the area of the metallic layers. Also, it is necessary to have a high aspect ratio for the conductive via. A conventional method for manufacturing a device having a conductive via generally utilizes the photosensitive benzocyclobutene (BCB) to act as a low-k dielectric material layer. However, the size of the conductive via is limited by the property of a polymer material of the negative-type photosensitive BCB when the conductive via having a small size is formed by exposing and developing the photosensitive BCB.

Referring to FIG. 1, it depicts a conventional semiconductor device 10. The semiconductor device 10 includes a silicon substrate 12, a plurality of metallic traces 16 and a low-k dielectric material layer 30 of a photosensitive BCB. The silicon substrate 12 is provided with a plurality of pads 15 adapted to be electrically connected to an integrated circuit (IC) (not shown) located on an active surface. The metallic traces 16 are disposed on the silicon substrate 12 and are electrically connected to the pads 15. The dielectric material layer 30 of the photosensitive BCB is patterned by exposing and developing processes, thereby defining through holes 20. A metallic material 22 is electroplated in the through hole 20 so as to form a conductive via 24 electrically connected to the metallic trace 16. The dielectric material layer 30 of the photosensitive BCB is made of a negative-type polymer material, and thus the resolution is not good when the through hole 20 is formed by exposing and developing the dielectric material layer 30 of the photosensitive BCB. The through hole 20 formed in the dielectric material layer 30 of the photosensitive BCB has an upper opening and a lower opening wherein the hole diameter of the upper opening is wider than that of the lower opening. Thus, the size of the conductive via 24 cannot be very small. Generally, considering the photosensitive BCB having a thickness t1 of 5 μm, the through hole 20 formed has a hole diameter d1 of 30 μm at most. Thus, the aspect ratio (the ratio of depth t1 to width d1) of the conductive via 24 must be limited to less than 1/6. Also, when a small-sized conductive via 24 is formed in the dielectric material layer 30 of the photosensitive BCB by the exposing and developing processes, it is easy to leave some residual BCB in the conductive via 24 and is hard to remove the some residual BCB. Thus, manufacturing and electrical problems tend to rise in the subsequent processes.

Referring to FIGS. 2 to 8, they depict a conventional method for manufacturing a device having a high aspect ratio via. Referring to FIG. 2, a silicon substrate 52 is provided, wherein the silicon substrate 52 has at least one pad 54 adapted to be connected to integrated circuits (ICs) (not shown) on an active surface. A seed metallic layer 56 is formed on the silicon substrate 52 and is electrically connected to the pad 54. A positive-type photosensitive photoresist layer 58 is formed on the silicon substrate 52 and the seed metallic layer 56. Referring to FIG. 3, the photoresist layer 58 is patterned by exposing and developing processes, thereby defining at least one through hole 62 exposing the seed metallic layer 56. The positive-type polymer material has better resolution during the exposing and developing processes, and thus the diameter of the through hole 62 of the photoresist layer 58 is smaller and the through hole 62 further has a high aspect ratio.

Referring to FIG. 4, at least one metallic material is electroplated in the through hole 62, thereby forming a metallic pillar 64, which is electrically connected to the seed metallic layer 56. Referring to FIG. 5, the photoresist layer 58 is removed. Referring to FIG. 6, a low-k dielectric material layer 66 made of negative-type benzocyclobutene (BCB) is coated on the silicon substrate 52, thereby sealing the seed metallic layer 56 and the metallic pillar 64. Referring to FIG. 7, the low-k dielectric material layer 66 is patterned by exposing and developing processes, thereby exposing a top surface of the metallic pillar 64. Referring to FIG. 8, a metallic trace 68 is formed on the low-k dielectric material layer 66 and is electrically connected to the metallic pillar 64.

However, after the coating process the low-k dielectric material layer 66 made of BCB is not located on a flat surface so as to affect the subsequent process for manufacturing the metallic trace 68.

Accordingly, there exists a need for method for manufacturing a device having a conductive via capable of solving the above-mentioned problems.

SUMMARY OF THE INVENTION

It is an object of the present invention to provide a method for manufacturing a device having a conductive via, wherein the predetermined aspect ratio of a through hole of a dielectric material layer can be substantially increased.

It is another object of the present invention to provide a method for manufacturing a device having a conductive via, wherein a metallic layer is formed with the cavity having a smaller curvature or is not formed with any cavity by a spin etching process.

In order to achieve the foregoing object, the present invention provides a method for manufacturing a device having a conductive via, the method including the following steps of: providing a substrate having at least one pad; forming a dielectric material layer on the substrate; forming a positive-type photoresist layer on the dielectric material layer; patterning the positive-type photoresist layer by exposing and developing processes, thereby forming at least one first through hole, wherein the first through hole exposes a part of the dielectric material layer; etching and moving the exposed dielectric material layer by an etching process, thereby forming at least one second through hole, wherein the second through hole exposes the pad, is communicated with the first through hole, and has a predetermined aspect ratio; removing the positive-type photoresist layer; forming a seed metallic layer on the dielectric material layer and in the second through hole, wherein the seed metallic layer is electrically connected to the pad; forming a metallic layer on the seed metallic layer, wherein the metallic layer is filled in the second through hole; etching and removing the metallic layer located over the seed metallic layer and outside the second through hole by a spin etching process, whereby the metallic layer located in the second through hole is formed to a lower portion of a conductive via; forming a photoresist layer on the seed metallic layer and the lower portion; patterning the photoresist layer so as to form at least one first through opening and at least one second through opening, wherein the first through opening exposes the lower portion, and the second through opening exposes a part of the seed metallic layer; electroplating a metallic material in the first and second through openings, whereby the metallic material located in the first through opening is formed to an upper portion of the conductive via, and the metallic material located in the second through opening is formed to a metallic trace; removing the patterned photoresist layer so as to expose a part of the seed metallic layer; and etching and removing the exposed part of the seed metallic layer.

According to the method for manufacturing the device having the conductive via of the present invention, the positive-type polymer material has better resolution during the exposing and developing processes, and thus the diameter of the first through hole of the photoresist layer is smaller. Further, the predetermined aspect ratio of the through hole of the dielectric material layer can be substantially increased and is not limited to less than ⅙. Furthermore, the metallic layer located in the through hole of the dielectric material layer is formed with the cavity having a smaller curvature, or is not formed with any cavity, because the etching velocity of the spin etching process in the horizontal direction is more or much more than that in the vertical direction. Thus, the photoresist layer can be flatly formed on the seed metallic layer and the metallic layer so as to avoid affecting the subsequent process for manufacturing the metallic trace.

The foregoing, as well as additional objects, features and advantages of the invention will be more apparent from the following detailed description, which proceeds with reference to the accompanying drawings.

DETAILED DESCRIPTION OF THE PREFERRED EMBODIMENT

Figure 1:
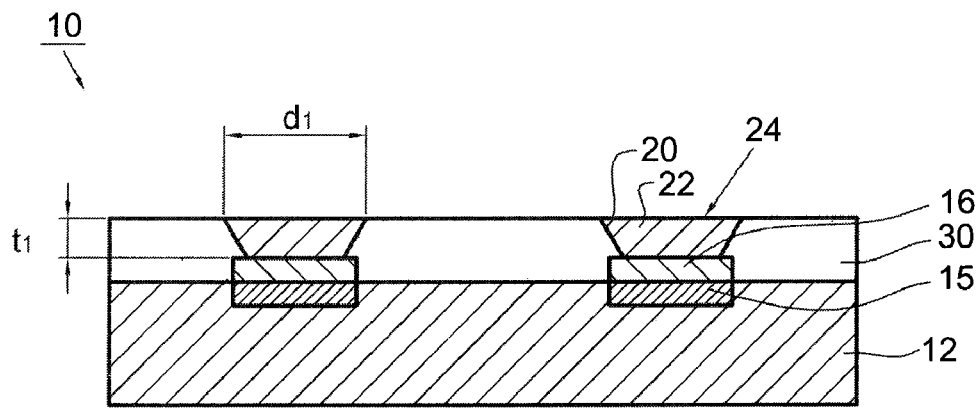
FIG. 1 is cross-sectional view of a semiconductor device having a conductive via in the prior art.
Figure 2:
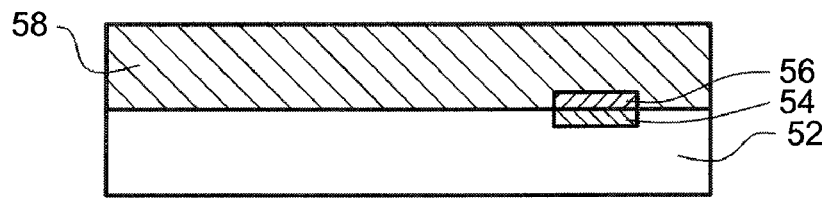
FIGS. 2 to 8 are cross-sectional views showing a method for manufacturing a semiconductor device having high aspect ratio via in the prior art.
Figure 3:
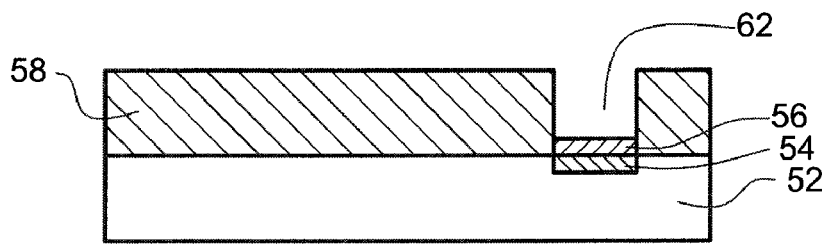
Figure 4:
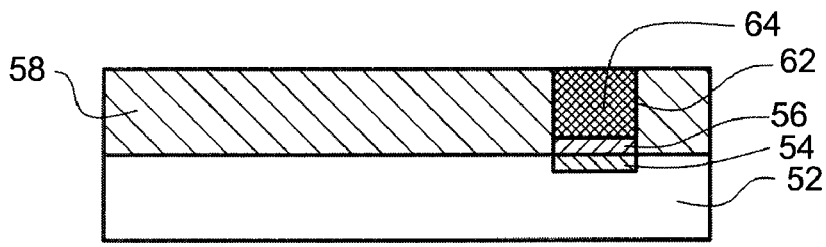
Figure 5:
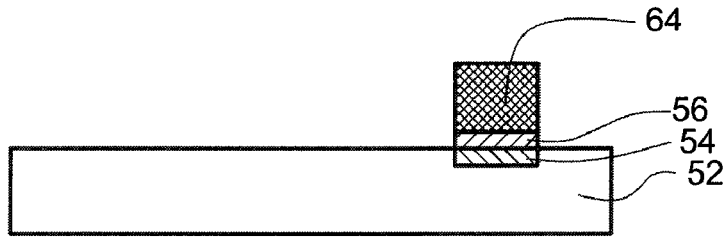
Figure 6:
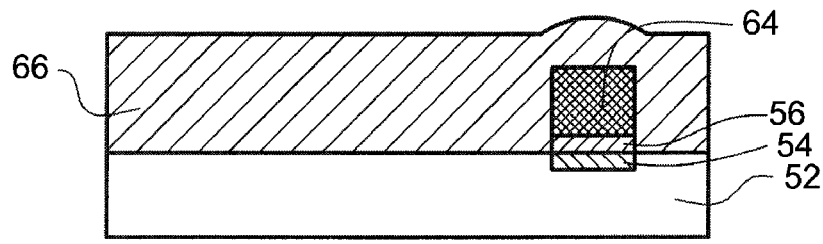
Figure 7:
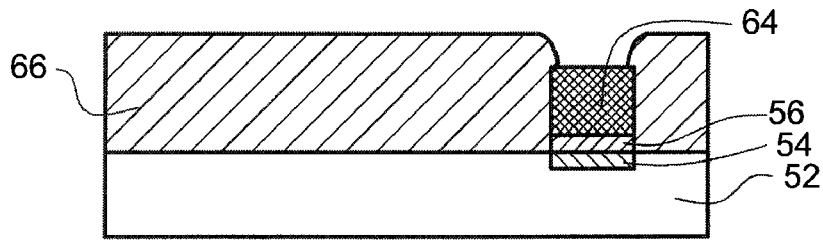
Figure 8:
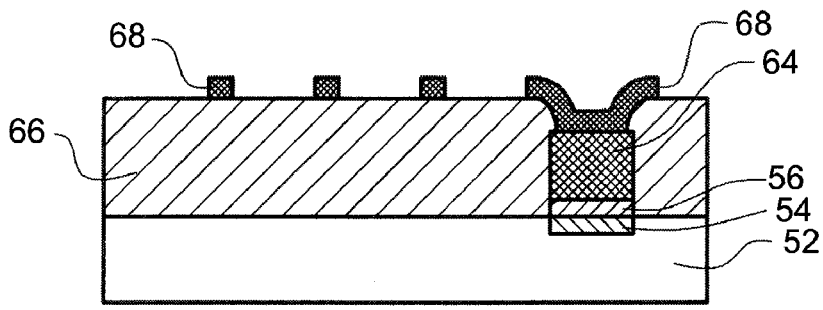
Figure 9:
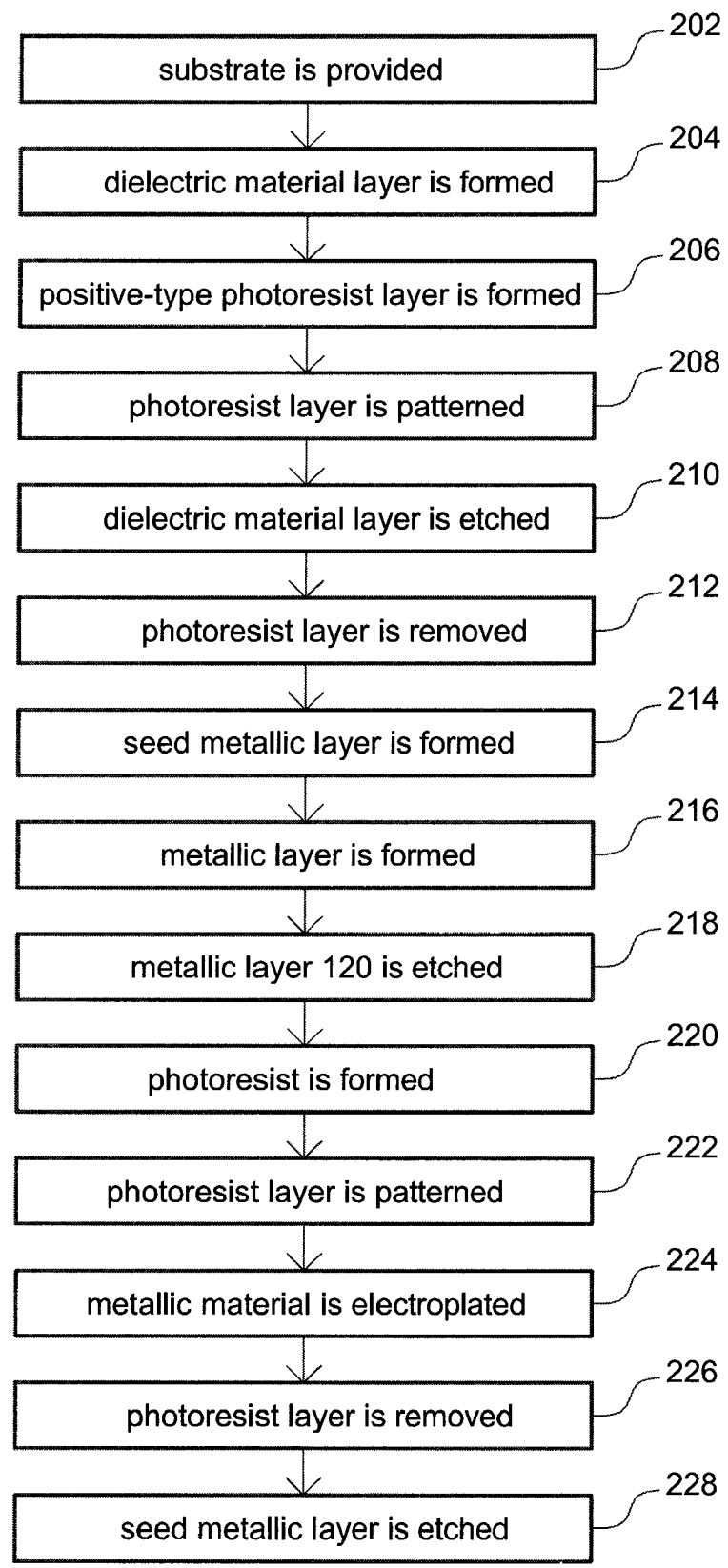
FIG. 9 is a flow diagram showing a method for manufacturing a device having a conductive via according to an embodiment of the present invention.
Figure 10:
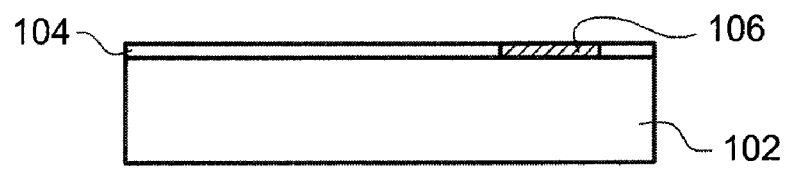
FIGS. 10 to 21 are cross-sectional views showing a method for manufacturing a device having a conductive via according to the embodiment of the present invention.

Referring to FIG. 9, it depicts a method for manufacturing a device having a conductive via according to an embodiment of the present invention. In this embodiment, the device is a semiconductor device. Referring to FIG. 10, in the step 202 a substrate 102, e.g. silicon substrate, having a passivating layer 104 and at least one pad 106 is provided, wherein the passivating layer 104 exposes the pad 106, and the pad 106 is adapted to be electrically connected to integrated circuits (ICs) (not shown) on an active surface.

Figure 11:
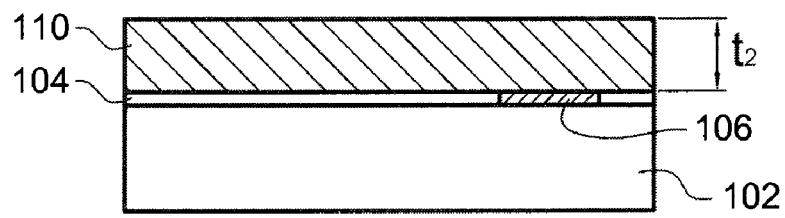

Referring to FIG. 11, in the step 204 a dielectric material layer 110 is formed on the passivating layer 104 of the substrate 102 by a coating process, wherein the dielectric material layer 110 has a predetermined thickness t2. The dielectric material layer 110 is made of a polymer material, e.g. low-k dielectric material of benzocyclobutene (BCB) or polyimide (PI), having a dielectric constant of less than 3.5.

Figure 12:
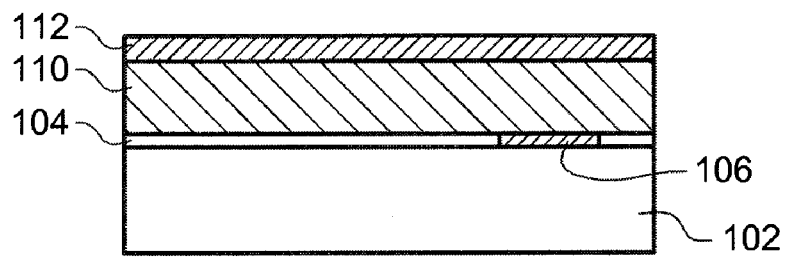
Figure 13:
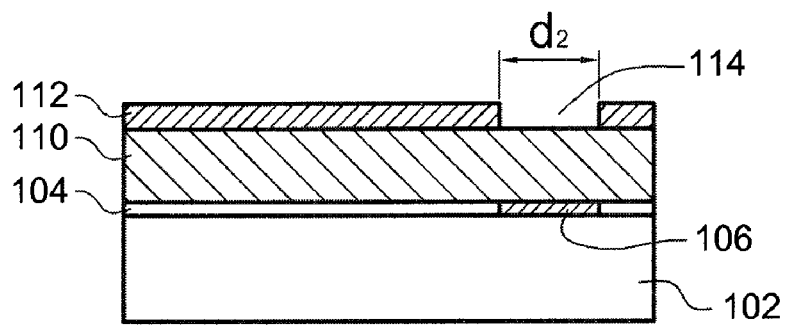

Referring to FIG. 12, in the step 206 a positive-type photoresist layer 58 is formed on the dielectric material layer 110. Referring to FIG. 13, in the step 208 the positive-type photoresist layer 112 is patterned by exposing and developing processes, thereby forming at least one first through hole 114, wherein the first through hole 114 exposes a part of the dielectric material layer 110 and has a predetermined diameter d2. The positive-type polymer material has better resolution during the exposing and developing processes, and thus the diameter of the first through hole 114 of the photoresist layer 112 is smaller.

Figure 14:
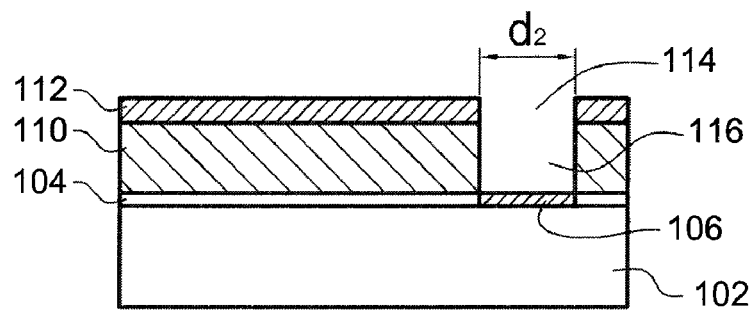

Referring to FIG. 14, in the step 210 the exposed par of the dielectric material layer 110 is etched and removed by an etching process, e.g. inductive coupling plasma (ICP) etching process, thereby forming at least one second through hole 116, wherein the second through hole 116 exposes the pad 106 and is communicated with the first through hole 114. The second through hole 116 has a predetermined aspect ratio, which is equal to the ratio of the predetermined thickness t2 to the predetermined diameter d2. Thus, the predetermined aspect ratio of the second through hole 114 is a high aspect ratio, that can be substantially increased and is not limited to less than ⅙.

Figure 15:
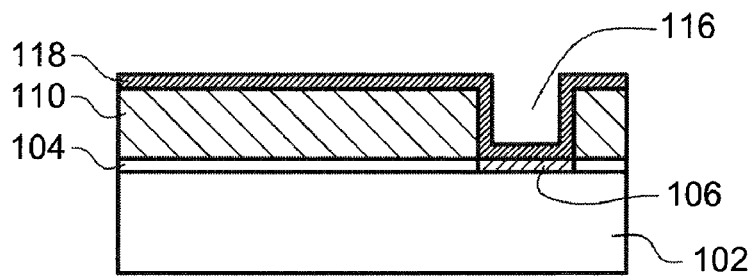

In the step 212 the positive-type photoresist layer 112 is removed. Referring to FIG. 15, in the step 214 a seed metallic layer 118 is formed on the dielectric material layer 110 and in the second through hole 116, and is electrically connected to the pad 106. For example, the seed metallic layer 118 can be made of titanium (Ti) and copper (Cu), and the metallic layers of Ti and Cu are sequentially formed on the dielectric material layer 110 and in the second through hole 116 by two sputtering processes. According to the connection between the dielectric material layer 110 and the metallic layer of Ti, the metallic layer of Ti can provide with better attachment. According to the subsequent electroplating process, the metallic layers of Cu can provide with better conductivity.

Figure 16:
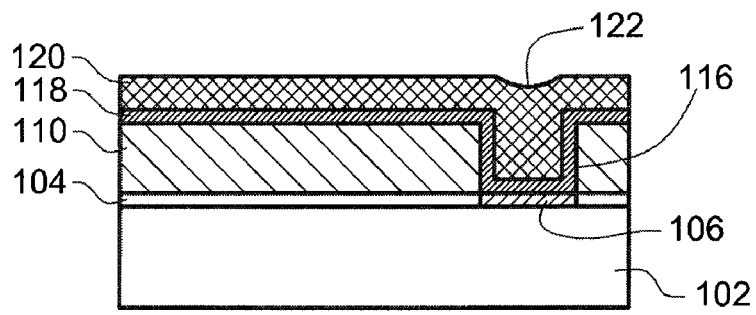

Referring to FIG. 16, in the step 216 a metallic layer 120 is formed on the seed metallic layer 118, and is filled in the second through hole 116. The metallic layer 120 is formed with a cavity 122 having a larger curvature and located above the second through hole 116 because of the second through hole 116.

Figure 17:
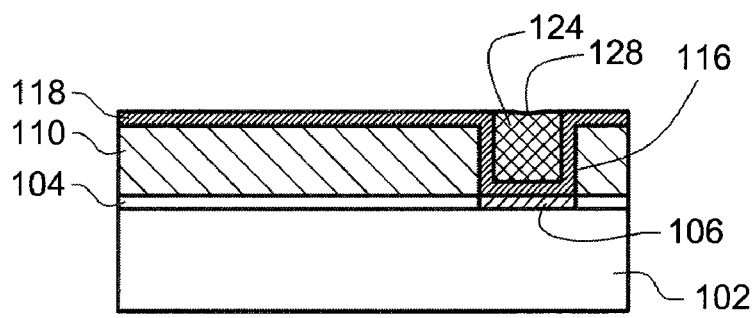

Referring to FIG. 17, in the step 218 the metallic layer 120 located over the seed metallic layer 118 and outside the second through hole 116 is etched and removed by a spin etching process, whereby the metallic layer 120 located in the second through hole 116 is formed to a lower portion 124. The top surface of the metallic layer 120 located in the second through hole 116 is formed with a cavity 128 having a smaller curvature, because the etching velocity of the spin etching process in a horizontal direction is more than that in a vertical direction. Otherwise, the top surface of the metallic layer 120 located in the second through hole 116 cannot be formed with any cavity by controlling the etching velocity in the horizontal direction being much more than that in the vertical direction.

Figure 18:
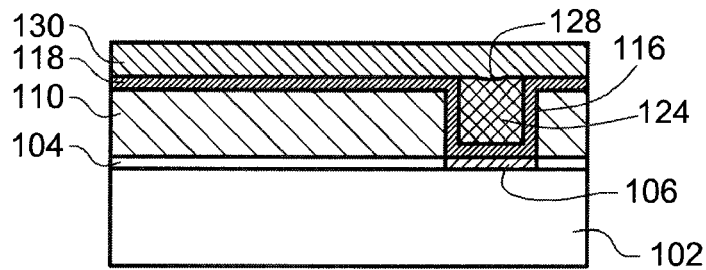

Referring to FIG. 18, in the step 220 a photoresist layer 130 is formed on the seed metallic layer 118 and the lower portion 124. The photoresist layer 130 can be flatly formed on the seed metallic layer 118 and the lower portion 124, because the metallic layer 120 located in the second through hole 116 is formed with the cavity 128 having a smaller curvature, or is not formed with any cavity.

Figure 19:
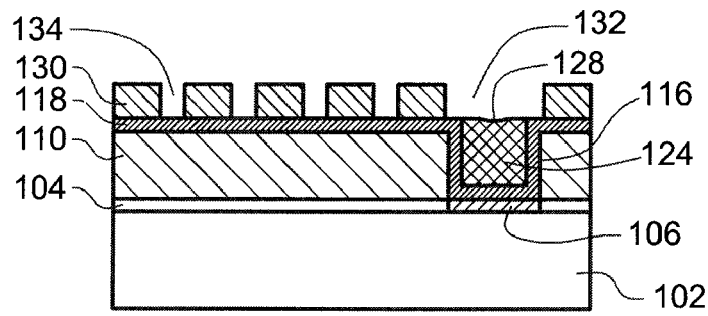

Referring to FIG. 19, in the step 222 the photoresist layer 130 is patterned so as to form at least one first through opening 132 and at least one second through opening 134, wherein the first through opening 132 exposes the lower portion 124, and the second through opening 134 exposes a part of the seed metallic layer 118.

Figure 20:
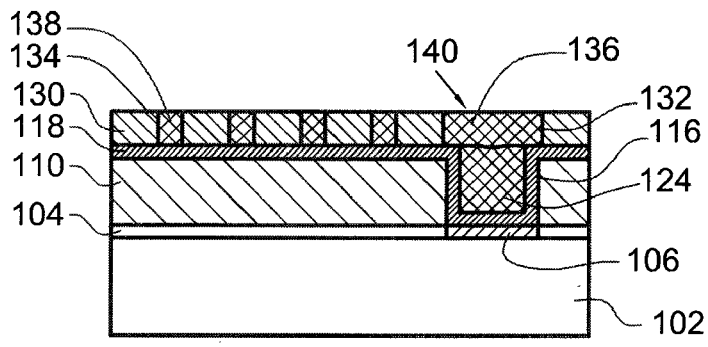

Referring to FIG. 20, in the step 224 a metallic material is electroplated in the first and second through openings 132, 134, whereby the metallic material located in the first through opening 132 is formed to an upper portion 136, and the metallic material located in the second through opening 134 is formed to a metallic trace 138, wherein the upper portion 136 and the lower portion 124 are formed to a conductive via 140, which has a predetermined aspect ratio being the same as the predetermined aspect ratio of the second through hole 114. In step 226 the patterned photoresist layer 130 is removed so as to exposes the part of the seed metallic layer 118.

If the steps 216 to 224 are simplified, in the simplified steps the conductive via 140 is formed on the seed metallic layer 118 located in the second through hole 116, and the metallic trace 138 is formed on the seed metallic layer 118 located on the dielectric material layer 110, wherein the conductive via 140 and the metallic trace 138 expose the part of the seed metallic layer 118.

Figure 21:
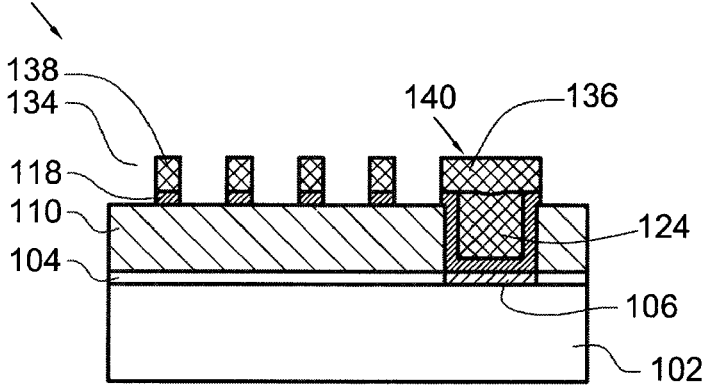

In the step 228 the exposed part of the seed metallic layer 118 is etched and removed, thereby preventing the seed metallic layer 118 from electrically interfering with the metallic trace 138 or the conductive via 140. Thus, the device 100 having the conductive via of the prevent invention is formed, shown in FIG. 21.

According to the method for manufacturing the device having the conductive via of the present invention, the positive-type polymer material has better resolution during the exposing and developing processes, and thus the diameter of the through hole of the photoresist layer is smaller. Further, the predetermined aspect ratio of the through hole of the dielectric material layer can be substantially increased and is not limited to less than 1/6. Furthermore, the metallic layer located in the through hole of the dielectric material layer is formed with the cavity having a smaller curvature, or is not formed with any cavity, because the etching velocity of the spin etching process in the horizontal direction is more or much more than that in the vertical direction. Thus, the photoresist layer can be flatly formed on the seed metallic layer and the metallic layer so as to avoid affecting the subsequent process for manufacturing the metallic trace.

Although the invention has been explained in relation to its preferred embodiment, it is not used to limit the invention. It is to be understood that many other possible modifications and variations can be made by those skilled in the art without departing from the spirit and scope of the invention as hereinafter claimed.

What is claimed is:

1. A method for manufacturing a device having a conductive via, the method comprising the following steps of:
   providing a substrate having at least one pad;
   forming a dielectric material layer on the substrate, wherein the dielectric material layer includes a through hole exposing the pad, and the through hole has a predetermined aspect ratio;
   forming a seed metallic layer on the dielectric material layer and in the through hole, wherein the seed metallic layer is electrically connected to the pad;
   forming a metallic layer on the seed metallic layer, wherein the metallic layer is filled in the through hole;
   etching and removing the metallic layer located over the seed metallic layer and outside the through hole by a spin etching process, whereby the metallic layer located in the through hole is formed to a lower portion;
   forming an upper portion on the lower portion, and forming a metallic trace on the seed metallic layer located on the dielectric material layer, wherein the upper and lower portions is formed to a conductive via having the predetermined aspect ratio, and the conductive via and the metallic trace expose a part of the seed metallic layer; and
   etching and removing the exposed part of the seed metallic layer.

2. The method as claimed in claim 1, wherein the steps for forming the upper portion and the metallic trace comprises the following steps of:
   forming a photoresist layer on the seed metallic layer and the lower portion;
   patterning the photoresist layer so as to form at least one first through opening and at least one second through opening, wherein the first through opening exposes the lower portion, and the second through opening exposes a part of the seed metallic layer; and
   electroplating a metallic material in the first and second through openings, whereby the metallic material located in the first through opening is formed to the upper portion, and the metallic material located in the second through opening is formed to the metallic trace.

3. The method as claimed in claim 1, wherein the upper portion is formed on the lower portion by an electroplating process, and the metallic trace is formed on the seed metallic layer located on the dielectric material layer by the electroplating process.

4. The method as claimed in claim 1, wherein the seed metallic layer is made of titanium (Ti) and copper (Cu).

5. The method as claimed in claim 4, wherein the seed metallic layer is formed on the dielectric material layer by two sputtering processes.

6. The method as claimed in claim 1, wherein the dielectric material layer has a predetermined thickness, the through hole has a predetermined diameter, and the predetermined aspect ratio is equal to the ratio of the predetermined thickness to the predetermined diameter.

7. The method as claimed in claim 1, wherein the dielectric material layer is made of a polymer material.

8. A method for manufacturing a device having a conductive via, the method comprising the following steps of:
   providing a substrate having at least one pad;
   forming a dielectric material layer on the substrate;
   forming a positive-type photoresist layer on the dielectric material layer;
   patterning the positive-type photoresist layer by exposing and developing processes, thereby forming at least one first through hole, wherein the first through hole exposes a part of the dielectric material layer;
   etching and removing the exposed part of the dielectric material layer by an etching process, thereby forming at least one second through hole, wherein the second through hole exposes the pad, is communicated with the first through hole, and has a predetermined aspect ratio;

removing the positive-type photoresist layer;

forming a seed metallic layer on the dielectric material layer and in the second through hole, wherein the seed metallic layer is electrically connected to the pad;

forming a metallic layer on the seed metallic layer, wherein the metallic layer is filled in the second through hole;

etching and removing the metallic layer located over the seed metallic layer and outside the second through hole by a spin etching process, whereby the metallic layer located in the second through hole is formed to a lower portion of a conductive via;

forming a photoresist layer on the seed metallic layer and the lower portion;

patterning the photoresist layer so as to form at least one first through opening and at least one second through opening, wherein the first through opening exposes the lower portion, and the second through opening exposes a part of the seed metallic layer;

electroplating a metallic material in the first and second through openings, whereby the metallic material located in the first through opening is formed to an upper portion of the conductive via, and the metallic material located in the second through opening is formed to a metallic trace;

removing the patterned photoresist layer so as to expose a part of the seed metallic layer; and etching and removing the exposed part of the seed metallic layer.

9. The method as claimed in claim 8, wherein the seed metallic layer is made of titanium (Ti) and copper (Cu).

10. The method as claimed in claim 9, wherein the seed metallic layer is formed on the dielectric material layer by two sputtering processes.

11. The method as claimed in claim 8, wherein the etching process is an inductive coupling plasma (ICP) etching process.

12. The method as claimed in claim 8, wherein the dielectric material layer has a predetermined thickness, the first through hole has a predetermined diameter, and the predetermined aspect ratio is equal to the ratio of the predetermined thickness to the predetermined diameter.

13. The method as claimed in claim 8, wherein the dielectric material layer is made of a polymer material.

14. The method as claimed in claim 13, wherein the polymer material is polyimide (PI).

15. The method as claimed in claim 8, wherein the device is a semiconductor device, and the substrate is a silicon substrate.

* * * * *